United States Patent
Hwang et al.

(10) Patent No.: US 7,300,880 B2
(45) Date of Patent: Nov. 27, 2007

(54) METHODS FOR FORMING FINE PHOTORESIST PATTERNS

(75) Inventors: Young Sun Hwang, Gyeongsangbuk-do (KR); Jae Chang Jung, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 343 days.

(21) Appl. No.: 10/719,083

(22) Filed: Nov. 21, 2003

(65) Prior Publication Data
US 2004/0266203 A1 Dec. 30, 2004

(30) Foreign Application Priority Data
Jun. 27, 2003 (KR) .................. 10-2003-0042523

(51) Int. Cl.
*H01L 21/302* (2006.01)
(52) U.S. Cl. .............. 438/706; 430/313; 430/270; 430/163; 428/132
(58) Field of Classification Search ........... 438/706
See application file for complete search history.

(56) References Cited

U.S. PATENT DOCUMENTS

| | | | |
|---|---|---|---|
| 5,702,776 A * | 12/1997 | Hayase et al. | 428/1.32 |
| 5,959,298 A * | 9/1999 | Belcher et al. | 250/338.3 |
| 5,962,191 A * | 10/1999 | Nozaki et al. | 430/287.1 |
| 6,153,499 A * | 11/2000 | Anda et al. | 438/579 |
| 6,190,824 B1 * | 2/2001 | Fukushige et al. | 430/163 |
| 6,261,721 B1 * | 7/2001 | Andrieu et al. | 429/249 |
| 6,506,535 B1 * | 1/2003 | Mizutani et al. | 430/270.1 |
| 6,541,361 B2 | 4/2003 | Ko et al. | |
| 6,692,892 B1 * | 2/2004 | Takano et al. | 430/270.1 |

FOREIGN PATENT DOCUMENTS

JP 11307437 11/1999

OTHER PUBLICATIONS

Meador et al.;193-nm Multilayer Imaging Systems; Proc. SPIE Zvol. 5039, Jun. 12, 2003; Advances in Resist Technology and Processing XX; Theodore H. Fedynyshyn, Ed.*
Material and Process Development of Tri-level Resist System in KrF and ArF Lithography; Proc. SPIE vol. 4690; Jul. 2002; ADvances in Resist Technology and Processing XiX; Theodore H. Fedynyshyn, Ed.*
SPI conference procedings; Proc. SPIE vol. 3999, Mar. 2000; High Performance 193-nm Possitive Resist Using Alternating Polymer Systems of Functionalized Cyclic Olefins/Maleic Anhydride also published at JRS Corporation in 2002.*

(Continued)

*Primary Examiner*—Nadine Norton
*Assistant Examiner*—Patricia A George
(74) *Attorney, Agent, or Firm*—Marshall, Gerstein & Borun LLP

(57) ABSTRACT

A method of forming a fine pattern by a tri-layer resist process to overcome a bi-layer resist process is disclosed. When a fine pattern is formed using a silicon photoresist, a gas protection film is coated on a photoresist to prevent exhaustion of silicon gas generated from the photoresist in light examination of high energy. As a result, lens of exposure equipment may be prevented from being contaminated.

5 Claims, 4 Drawing Sheets

OTHER PUBLICATIONS

J. Meute of IBM "157nm Stepper Optics Lifetime Field Experience" presentation at Semitech—Dec. 2001.*

Shibata et al. of Material and Process Development of Tri-level Resist System in KrF and ArF Lithography [Proc. SPIE vol. 4690, Jul. 2002, Advances in Resist Technology and Processing XIX.*

Meador et al. (193-nm Multilayer Imaging Systems; Proc. SPIE vol. 5039, Jun. 2003, Advances in Resist Technology and Processing XX; Theodore H. Fedynyshyn; Ed.).*

Samoc et al. "Photophysical Processes Involved in Creation of Dark Spatial Solitons in Composite Photonic Media", Laser Physics Centre, Australian National University, Canberra, ACT 0200, Au, 1993; 5420197; 6306439.*

Barclay et al., "Bilayer Technology for ArF and F2 Lithography: The Development of Resists to Minimize Silicon Outgassing" Proc. SPIE, 2003, vol. 5039, p. 453□□.*

Kishkovich et al. "Prevention of Optics and Resist Contamination in 300nm Lithography: Improvements in Chemical Air Filtration," in Proceedings of Metrology, Inspection, and Process Control for Microlithography XV (Bellingham, WA: SPIE, 2001), 739-752.*

Kishkovich et al., "Real-Time Methodologies for Monitoring Airborne Molecular Contamination in Modern DUV Photolithography Facilities," in Proceedings of Metrology, Inspection, and Process Control for Microlithography XIII (Bellingham, WA: SPIE, 2001), 348-376.*

Guidelines On Styles For Technical Writing, Will Hopkins PhD, University Otago, Dunedin, New Zealand; 1999.*

Wolf; Silicon Processing for the VLSI Era; p. 408; lattice Press; 1986.*

* cited by examiner

_US 7,300,880 B2_

METHODS FOR FORMING FINE PHOTORESIST PATTERNS

This application claims priority to foreign application 2003-42523 filed in the Republic of Korea on Jun. 27, 2003.

TECHNICAL FIELD

The forming of fine photoresist patterns using a tri-layer resist process is disclosed which overcomes problems associated with bi-layer resist processes. As disclosed herein, when a fine photoresist pattern is formed using a silicon photoresist, a gas protection film is coated on a photoresist to prevent exhaustion of silicon gas generated from the photoresist in light examination of high energy. As a result, contamination of the lens of the exposure equipment can be prevented.

DESCRIPTION OF THE RELATED ART

As the size of photoresist pattern used in a semiconductor processes becomes smaller, the thickness of photoresist must be thinner. However, as the thickness of photoresist becomes thinner, the photoresist does not adequately serve as an etching mask in a subsequent etching process. In order to overcome this drawback, a bi-layer resist process has been introduced.

FIGS. 1a to 1d show the general bi-layer resist process.

Referring to FIG. 1a, a layer 30 is coated on an underlying layer 20 of a semiconductor substrate 10. The layer 30 is used as an etching mask when the underlying layer 20 is etched. The etching mask layer 30 is generally an i-line photoresist hardened at a high temperature.

A photoresist 40 which responds to light is coated on the etching mask layer 30. Here, the photoresist 40 includes silicon. The above-stacked structure is exposed using an exposure mask 50.

After the exposure process shown in FIG. 1a, a wet development process is performed to form a photoresist film pattern 42 as shown in FIG. 1b.

A dry etching process is performed using the photoresist film pattern 42 as an etching mask with O2 plasma. Here, the photoresist film pattern 42 including silicon is changed a silicon oxide film 60 by oxygen.

The lower etching mask layer 30 is etched using the silicon oxide film 60 as an etching mask to form an etching mask pattern 32 shown in FIG. 1c.

Next, the underlying layer 20 is etched using the etching mask pattern 32 formed in FIG. 1c. Then, a cleaning process is performed to form an underlying layer pattern 22 shown in FIG. 1d.

In order to reduce the size of patterns, high-energy light sources such as ArF (193 nm), VUV (157 nm) or EUV (13 nm) are used in a photolithography process. However, when the exposure process is performed using a high-energy light source, the combination of resins in the photoresist is broken down to generate undesired by-product gases. In the case of photoresist including silicon, silicon gas is created. The silicon gas generated by the exposure process reacts to air and the silicon is transformed into SiO2 and then deposited on the lens. There is no known method for removing SiO2, and the expensive lens of the scanner and the stepper must be frequently replaced.

As a result, it is expensive to use the bi-layer resist process with a photoresist that includes silicon.

SUMMARY OF THE DISCLOSURE

A method of forming a fine pattern using a silicon photoresist is disclosed which prevents generation of silicon gas and the problems associated therewith.

DETAILED DESCRIPTION OF THE PRESENTLY PREFERRED EMBODIMENTS

A method of forming a fine photoresist pattern is disclosed wherein a gas protection film is coated on the photoresist film created with a bi-layer resist process.

A disclosed method for forming a fine pattern comprises:

(a) coating an etching mask layer on an underlying layer;

(b) coating a photoresist composition including silicon on the etching mask layer to form a photoresist film;

(c) coating a gas protection film on the photoresist film;

(d) performing a photolithography process on the resulting structure to form a photoresist film pattern;

(e) etching the etching mask layer of the step (b) using the photoresist film pattern as an etching mask to form an etching mask pattern; and (f) forming an underlying layer pattern by an etching process using the etching mask pattern.

Although the etching mask layer of the step (a) is not necessarily limited, an I-line photoresist or KrF photoresist having etching resistance to an underlying layer is preferably used.

Preferably, the photoresist film used in the step (b) is one of the photoresist films suitable for a photolithographic process employing light sources such as ArF (193 nm), VUV (157 nm) or EUV (13 nm).

The gas protection film of the step (c) is preferably water-soluble polymer material having excellent permeability to light. The gas protection film is capable of absorbing silicon gas generated from the underlying photoresist film upon exposure to light.

The water-soluble polymer material is preferably selected from the group consisting of poly(methyl methacrylate/acrylic acid), poly(methyl acrylate/acrylic acid), poly(dimethyl acrylate/methyl acrylate), poly(dimethyl acrylate/methyl methacrylate), poly(vinyl pyrrolidone), poly(dimethyl acrylate) and mixture thereof.

The light used ArF (193 nm), VUV (157 nm) or EUV (13 nm).

The step (c) comprises:

(c-1) spin coating a gas protection composition on the resultant surface of (b); and (c-2) baking the coated gas protection composition.

A disclosed method of forming a fine pattern in accordance with certain preferred embodiments will be described in detail with reference to the accompanying drawings.

Figure 1A:
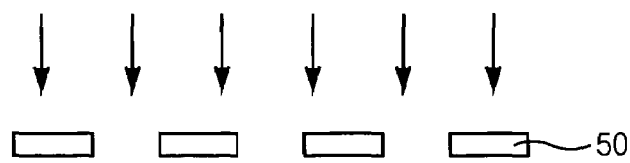
FIGS. 1a through 1d are cross-sectional diagrams illustrating a conventional method of forming a photoresist pattern with a conventional bi-layer resist process.
Figure 1A:
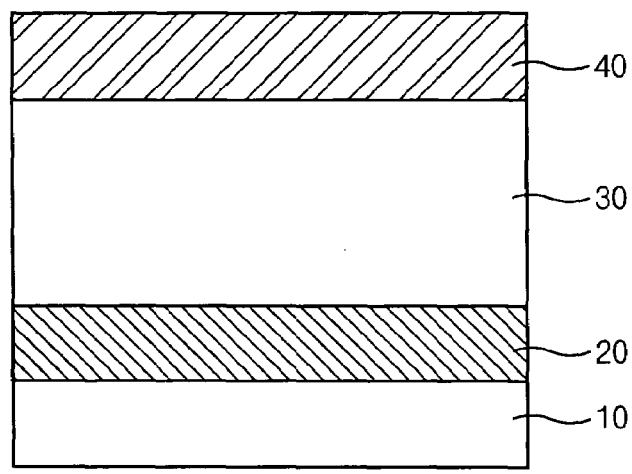
Figure 1B:
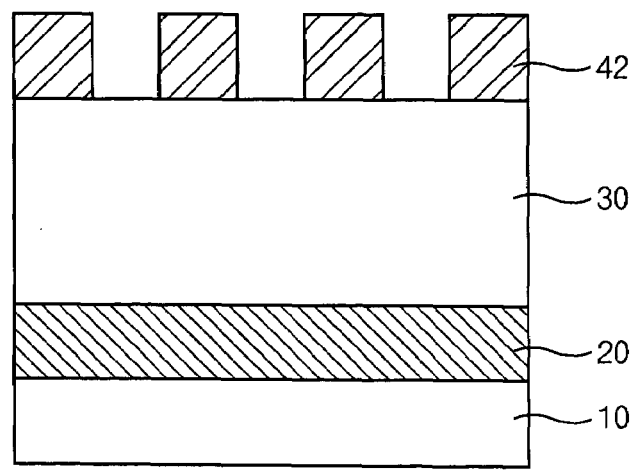
Figure 1C:
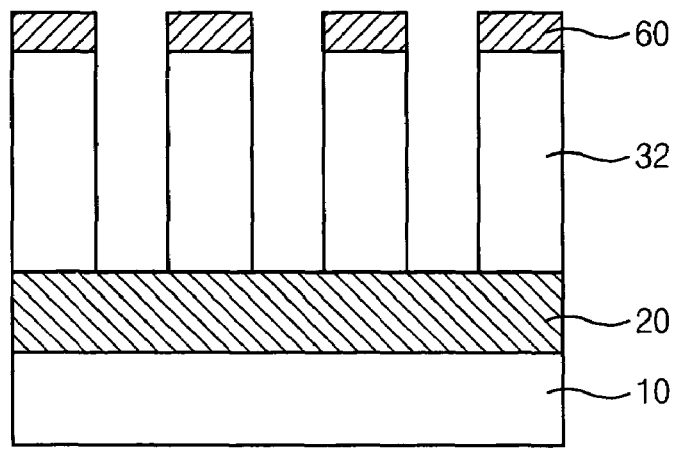
Figure 1D:
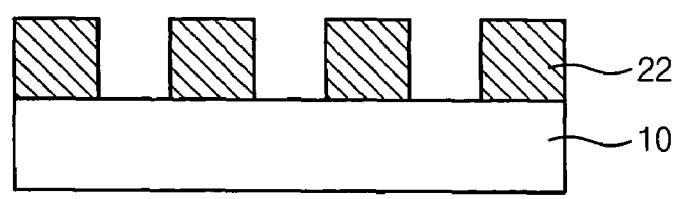
Figure 2A:
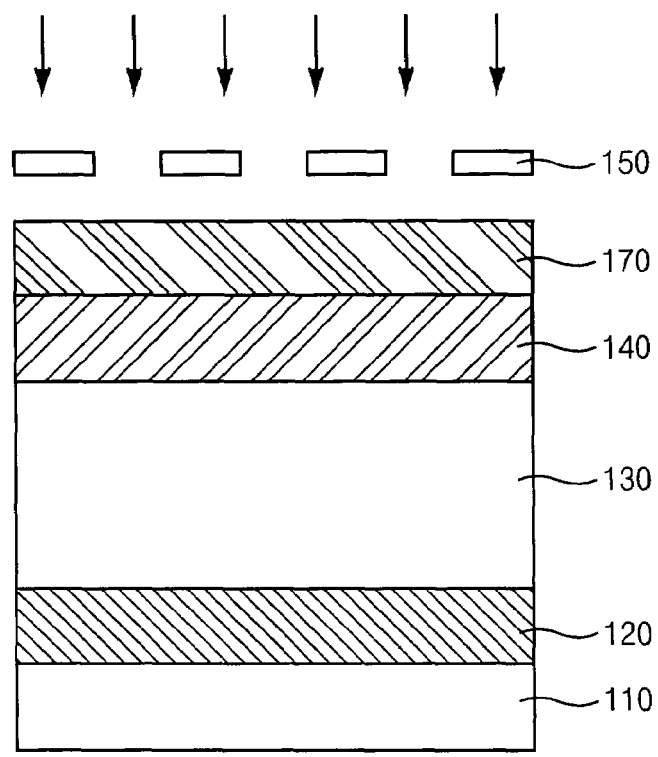
FIGS. 2a through 2d are cross-sectional diagrams illustrating a disclosed method of forming a photoresist pattern with a tri-layer resist process.

Referring to FIG. 2a, an etching mask layer 130 is coated on an underlying layer 120 of a semiconductor substrate 110. The etching mask layer 130 is generally an i-line photoresist or KrF photoresist hardened at a high temperature.

A photoresist 140 which responds to light is coated on the etching mask layer 130. Here, the photoresist 140 includes silicon as described above. A gas protection film 170 is spin coated on the photoresist 140, and exposed using an exposure mask 150.

A silicon gas generated from the photoresist film by the exposure process is adsorbed onto the gas protection film 170. As a result, exhaustion of the silicon gas into the exposure equipment is prevented, and lens of the exposure equipment are not damaged by the oxidized silicon gas (SiO2).

After the exposure process of FIG. 2a, a photoresist film pattern 142 is formed via a wet development process.

Since the gas protection film 170 has excellent permeability to light, light reaches easily the lower photoresist film when the gas protection film 170 is exposed to light. Additionally, since the gas protection film 170 comprises a water-soluble polymer, it is easily removed by a wet development process.

Figure 2B:
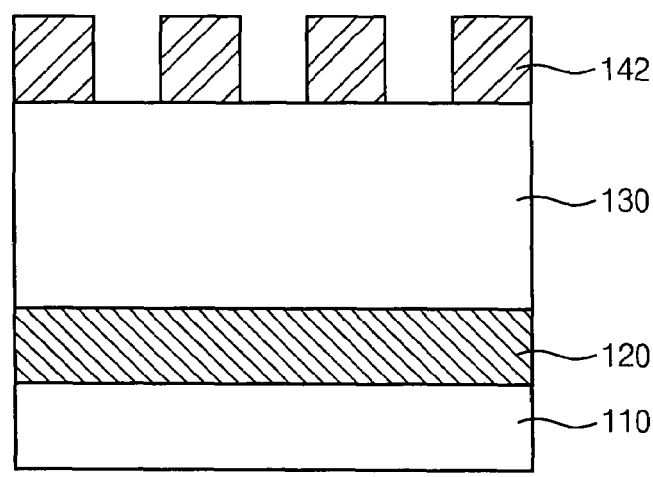

A dry etching process using O2 plasma is performed on the etching mask layer 130 using the photoresist film pattern 142 formed in FIG. 2b as an etching mask.

The photoresist film pattern 142 including silicon is transformed into a silicon oxide film 160 by oxygen. The lower etching mask layer 130 is etched using the silicon oxide film 160 as an etching mask to form an etching mask pattern 132 as shown in FIG. 2c.

Figure 2C:
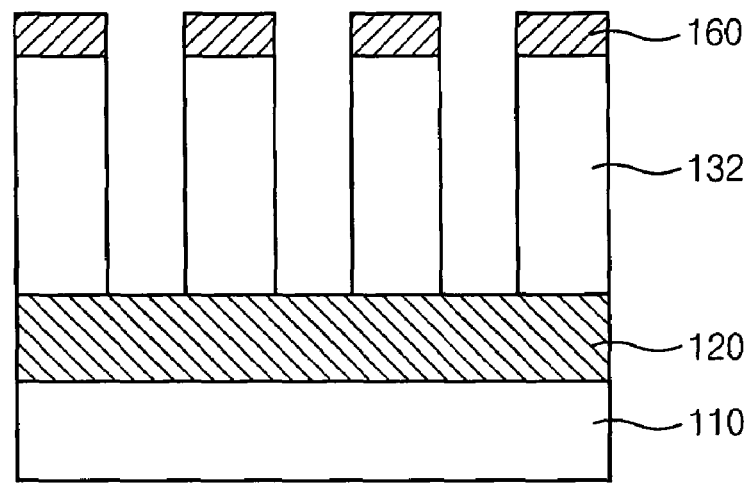
Figure 2D:
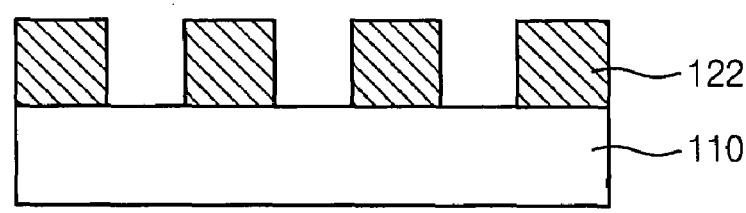

The underlying layer 120 is etching using the etching mask pattern 132 formed in FIG. 2c. Then, a cleaning solution is performed on the resulting structure: to obtain a desired an underlying layer pattern 122 as shown in FIG. 2d.

As discussed earlier, when a fine pattern is formed using a silicon photoresist in accordance with the disclosed method, a gas protection film is further coated on a photoresist to effectively prevent exhaustion of silicon gas generated by exposure. Accordingly, lens of exposure equipment may not be contaminated by silicon gas.

What is claimed is:
1. A method for forming a photoresist pattern comprising:
   (a) preparing a gas protection composition comprising a water-soluble polymer selected from the group consisting of copolymers of methyl methacrylate and acrylic acid, copolymers of methyl acrylate and acrylic acid, and mixtures thereof;
   (b) forming an etching mask layer on an underlying layer;
   (c) applying a photoresist composition including silicon on the etching mask layer to form a photoresist film;
   (d) applying the gas protection composition on the photoresist film, thereby forming a gas protection film;
   (e) performing a photolithography process on the resulting structure to form a photoresist film pattern;
   (f) etching the etching mask layer of step (b) using the photoresist film pattern as an etching mask to form an etching mask pattern; and,
   (g) forming an underlying layer pattern by an etching process using the etching mask pattern.

2. The method according to claim 1, comprising forming the etching mask layer of step (a) by coating an i-line photoresist or KrF photoresist.

3. The method according to claim 1, wherein the photoresist composition is suitable for a photolithographic process employing a light source selected from the group consisting of ArF (193 nm), VUV (157 nm) and EUV (13 nm).

4. The method according to claim 1, wherein the photolithography process employs a light source selected from the group consisting of ArF (193 nm), VUV (157 nm) and EUV (13 nm).

5. The method according to claim 1, wherein step (d) further comprises:
   (d-1) spin coating the gas protection composition on the resultant surface of step (c); and,
   (d-2) baking the coated gas protection composition.

* * * * *